United States Patent
Ogawa et al.

(10) Patent No.: US 7,458,824 B2
(45) Date of Patent: Dec. 2, 2008

(54) ELECTRIC JUNCTION BOX INCLUDING ELECTRIC UNIT IN PLURAL SHIELD CASE MEMBERS

(75) Inventors: Kikuo Ogawa, Shizuoka (JP); Hitoshi Tsugane, Shizuoka (JP); Koichi Yamamoto, Shizuoka (JP)

(73) Assignees: Yazaki Corporation, Tokyo (JP); Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 11/653,981

(22) Filed: Jan. 17, 2007

(65) Prior Publication Data

US 2007/0167040 A1    Jul. 19, 2007

(30) Foreign Application Priority Data

Jan. 19, 2006    (JP) .............................. 2006-010723

(51) Int. Cl.
    *H01R 12/00* (2006.01)
(52) U.S. Cl. ...................... 439/76.2; 439/76.1; 439/607
(58) Field of Classification Search ................ 439/76.1, 439/76.2, 607
    See application file for complete search history.

(56) References Cited

U.S. PATENT DOCUMENTS

| 5,879,170 | A | * | 3/1999 | Nogami ...................... 439/76.1 |
| 5,982,624 | A | * | 11/1999 | Onoda et al. ................. 361/737 |
| 6,179,662 | B1 | * | 1/2001 | Kuo ............................ 439/607 |
| 6,428,330 | B1 | * | 8/2002 | Poulter et al. ............... 439/76.1 |
| 6,719,570 | B2 | * | 4/2004 | Tsuchioka .................. 439/76.1 |

FOREIGN PATENT DOCUMENTS

| JP | 9-270277 | 10/1997 |
| JP | 2003-170531 | 6/2003 |

* cited by examiner

*Primary Examiner*—Tho D Ta
(74) *Attorney, Agent, or Firm*—Kratz, Quintos & Hanson, LLP

(57) ABSTRACT

Providing an electric junction box, which can reduce a cost and the weight with maintaining shield effect, in the electric junction box including an electric unit and a shield case, a panel joint at a panel joining area of a conductive panel is formed with synthetic resin. The shield case can be formed with a thin sheet metal by press forming. The electric unit is received in the shield case, so that the electric junction box can maintain shield effect.

7 Claims, 6 Drawing Sheets

ELECTRIC JUNCTION BOX INCLUDING ELECTRIC UNIT IN PLURAL SHIELD CASE MEMBERS

The priority application Number Japan Patent Application 2006-010723 upon which this patent application is based is hereby incorporated by reference.

BACKGROUND OF THE INVENTION

1. Field of the Invention

This invention relates to an electric junction box to be mounted on an automobile as a vehicle for receiving an electric unit.

2. Description of the Related Art

In an automobile as a vehicle, various electronic apparatuses, such as a lamp like a headlamp or a tail lamp and a motor like a starter motor and a motor for air-conditioner, are installed.

For supplying electric power to the various apparatuses, a junction block is disposed at a suitable position in the automobile. The junction block is structured together with various electric circuit elements such as many fuses and relays.

The junction block includes a fuse, a relay and a bus bar, so that the junction block may be called a fuse block, a relay box or generally an electric junction box. In this specification, the fuse block, the relay box and the junction block will be called generally the electric junction box.

The electric junction box includes a case main body forming an outer surface and a terminal. On a top surface of the case main body, a plurality of mount units for mounting the electric elements, such as the relay, the fuse and a fusible link, is disposed. At a bottom surface of the case main body, a connector of a wiring harness wired in the automobile is fitted.

The wiring harness includes a plurality of electric wires and a connector joined with an end of the electric wires. The connector is fitted to the various electronic apparatus installed in the automobile or the aforesaid case main body. The case main body receives a bus bar connecting various electric elements to be mounted on the mount unit and the terminals of the connector of the wiring harness according to a predetermined connecting pattern.

The terminal made of thick conductive sheet metal includes a plate-like electric contact portion and a wire joint portion integrally. At the electric contact portion, a hole or a cutout, through which a thread portion of a bolt passes, is provided. The electric contact portion is mounted on the aforesaid case main body by screwing the bolt, the thread portion of which passes through the hole or the cutout, on the top surface of the case main body.

The wire joint portion is bent at an end of the electric portion, thereby the wire joint portion extends perpendicularly from the electric contact portion. By crimping the electric wire with crimp pieces, a core wire of the electric wire is joined with the electric contact portion.

The electric contact portion joined with the electric wire of the terminal is mounted on the top surface of the case main body of the electric junction box with the bolt. In this condition, the wire joint portion and the electric wire joined with the wire joint portion are arranged along an outer surface of the case main body not to be received in the case main body.

Predetermined electric elements are mounted on each mount units, and the connector of the wiring harness is fitted at the bottom surface of the case main body. Thus, the electric junction box is assembled. Thereby, the electric junction box distributes electric power supplied from an electric power source through the fusible link and electric wires of the wiring harness to the electronic apparatuses.

The electric junction box used in a wet condition includes a packing. Dividing the case main body to a plurality of case members, receiving an electric unit in the divided case members, and combining the divided case members, between each dividing face of which the packing is clamped, an inside of the case main body is water-sealed to prevented water penetration from an outside of the case main body.

Patent Document 1 discloses a water-sealed case, which is divided to a top case and a bottom case by a dividing plane to be slant against a circuit board and not to interfere with a connector opening for projecting a connector. According to such structure, a water-sealed structure by the top and bottom cases is given without interference with a water-sealed structure of the connector. Patent Document 1 is the Japan Published Patent

SUMMARY OF THE INVENTION

Objects to be Solved

According to the above electric junction box, a metal case member is used for EMI (Electro-Magnetic Interference) shield, and a thickness of the case member is not smaller than at least minimum thickness to meet required EMI shield effect. The case member will be formed by a sinking mill or die-casting. When forming by the sinking mill, a drawing die is very expensive and a partially thick portion is generated to meet the standard thickness. When forming by die-casting to flow melted aluminum into a die, a wall thickness is thicker to prevent blowholes and ununiformity of thickness than that by the sinking mill. Thereby, it is difficult to decrease a cost and a weight of the electric junction box for EMI shield.

According to the above problem, an object of the present invention is to provide an electric junction box, which can reduce a cost and a weight thereof to maintain shield performance.

How to Attain the Object of the Present Invention

In order to overcome the above problems and attain the object of the present invention, an electric junction box is characterised in that the electric junction box includes an electric unit and a shield case receiving the electric unit, and the shield case includes electric conductive panels and a panel joint made of synthetic resin to be provided at a panel joining area.

The electric junction box is further characterised in the electric junction box mentioned above in that the shield case comprises a plurality of case members to be separated, which are combined to each other so as to form a receiving space for receiving the electric unit in the shield case.

The electric junction box is further characterised in the electric junction box mentioned above in that the case members includes respectively a receiving section, which forms the receiving space for receiving the electric unit, and an opening formed at one end of the receiving section, and the openings of the plurality of case members are combined to each other so as to form the shield case.

The electric junction box is further characterised in the electric junction box mentioned above in that the case members includes respectively a combining piece made of synthetic resin to combine the mating case member, and the combining piece projects from the opening.

The electric junction box is further characterised in the electric junction box mentioned above in that the opening is formed in parallel to a plane, which is the smallest projected area of the shield case.

The electric junction box is further characterised in the electric junction box mentioned above in that the shield case includes amount portion for mounting the shield case on a mating object, and the mount portion is formed integrally with the panel joint.

The electric junction box is further characterised in the electric junction box mentioned above in that a thickness of the panel is not smaller than at least minimum thickness to meet required shield effect.

EFFECT OF THE INVENTION

According to the electric junction box of the invention, the shield case is structured with the conductive panels and the panel joint made of synthetic resin to be provided at the area of jointing the panels. Thereby, the shield case can be formed with a thinner wall, and a weight of the shield case can become lighter. The panel joint maintains strength of the shield case. Thus, with maintaining the shield effect, cost down and lighter weight of the shield case can be realized.

According to the invention, by dividing the shield case into the plurality of case members and combining the case members to each other so as to form a receiving space for receiving the electric unit in the shield case, the plurality of case members can be made of thin sheet metal. Thereby, the shield case can be formed with a thinner wall, and cost down and lighter weight of the shield case can be realized.

According to the invention, by forming the case member with the opening formed and the receiving section, and combining the openings of the plurality of case members to each other, the shield case is formed. Thereby, each portion of combining the case members includes a flat surface. The shield case can be high water-sealed stably.

According to the invention, by forming the case member integrally with a combining piece, high connecting pressure can be loaded on the combining piece. Thereby, the shield box can be high water-sealed stably.

According to the invention, by forming the opening of the case member in parallel to a plane, which is the smallest projected area of the shield case, an boundary area between the case members can be made smaller. Thereby, uniform pressure can be applied on a packing surface, so that the shield box can be high water-sealed stably.

According to the invention, by forming the mount portion for mounting the shield case on a mating object integrally with the panel joint, the mount portion can be formed integrally with the shield case. Thereby, the shield case can be manufactured with reduced cost.

According to the invention, by forming the thickness of the panel not smaller than at least minimum thickness to meet required shield effect, the weight of the panel can be reduced.

The above and other objects and features of this invention will become more apparent from the following description taken in conjunction with the accompanying drawings.

DESCRIPTION OF THE PREFERRED EMBODIMENT

One embodiment of an electric junction box according to the present invention will be described as followings with reference to FIGS. 1-6.

Figure 1:
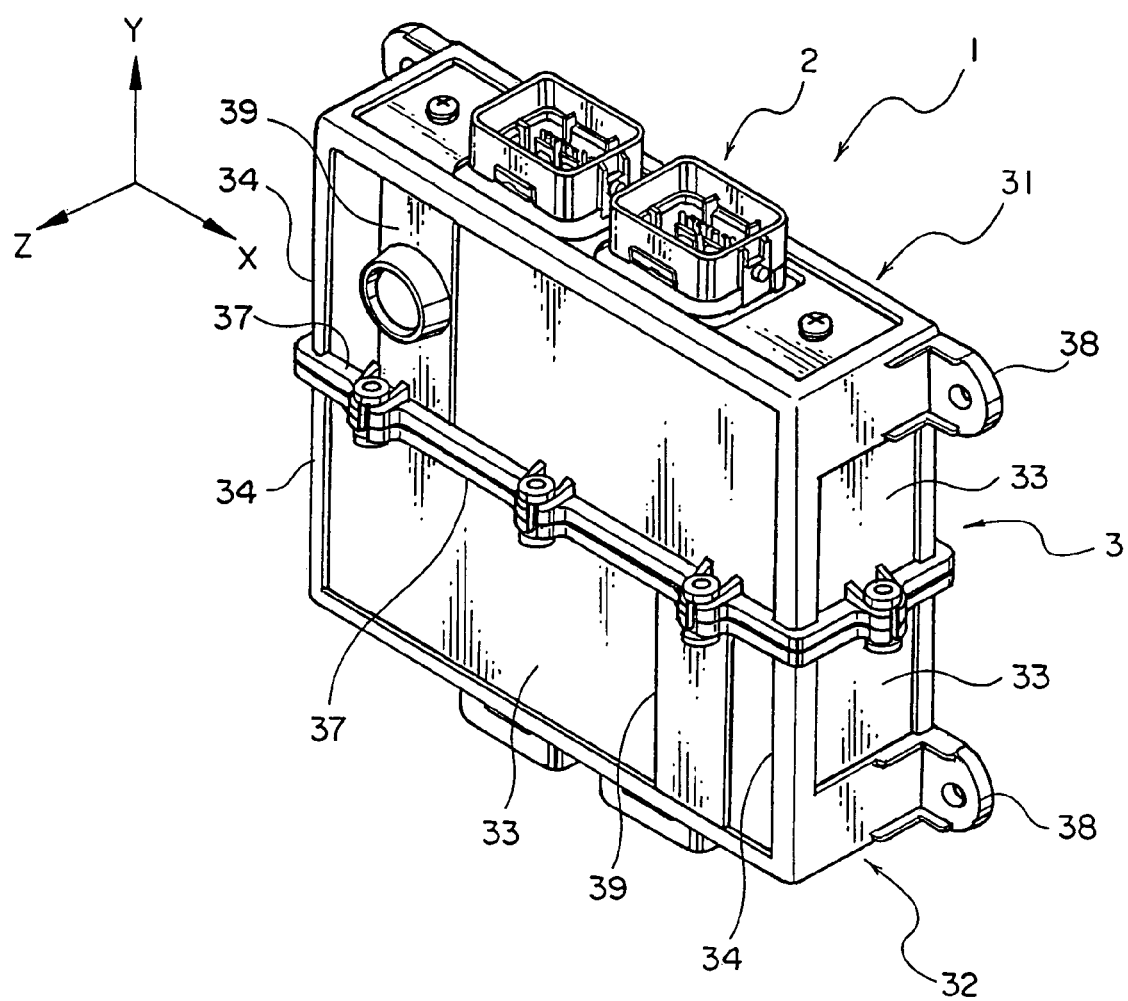
FIG. 1 is a perspective view of an embodiment of an electric junction box according to the present invention.
Figure 2:
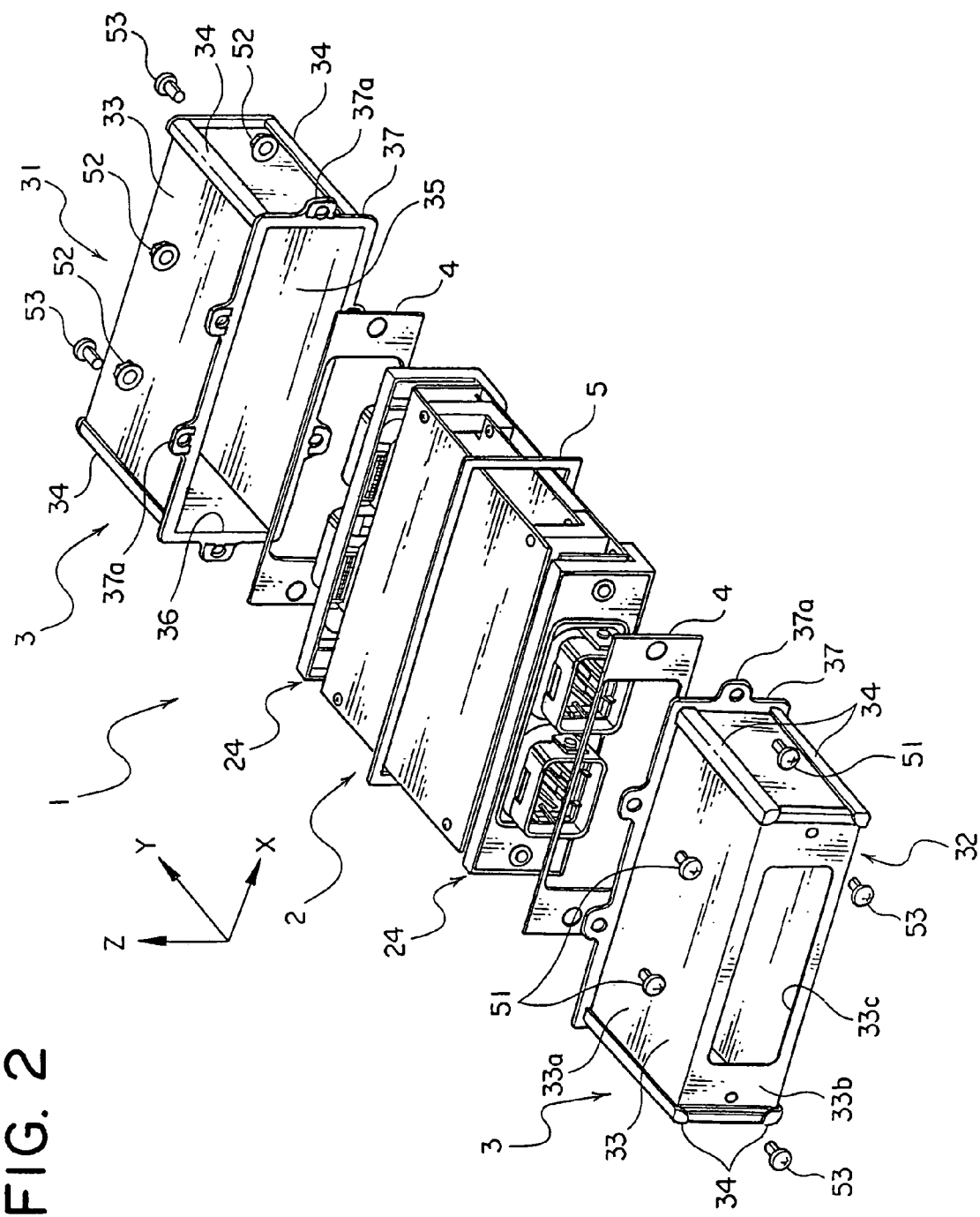
FIG. 2 is an exploded perspective view of the electric junction box shown in FIG. 1.

The electric junction box 1 shown in FIG. 1, according to the present invention, is installed in an automobile as a vehicle. The electric junction box 1, as shown in FIGS. 1-6, includes an electric unit 2, a shield case 3 receiving the electric unit 2, an insulation rubber panel 4 and a insulation rubber cover 5.

The electric unit 2 is formed into a rectangular shape capable to be received in the shield case 3. The electric unit 2 includes a first base board 21 as a base, a second base board 22 and a third base board 23 both mounted on the first base board 21, a pair of connector units 24 and a plurality of stays 25 (4 stays in FIG. 3) for mounting the second base board 22 and the third base board 23 on the first base board 21.

The first base board 21 is formed into a rectangular shape. The first base board has connector mount portions (not shown) for mounting the connector units 24 at both ends thereof and a wiring pattern (not shown) to be connected electrically with the connector units mounted at the connector mount portions.

Each stay 25 is made of synthetic resin. The stays 25 are fixed on the first base board 21 so as to project from the first base board 21. Each stay 25 includes a hollow first cylindrical portion 25a and a hollow second cylindrical portion 26b longer than the second cylindrical portion 25a. The first cylindrical portion 25a and the second cylindrical portion 25b have respectively an internal threaded hole. So as to arrange one end of the first cylindrical portion 25a and one end of the second cylindrical portion 25b in the same plane, and make the other ends thereof have different lengths, the first cylindrical portion 25a and the second cylindrical portion 25b are formed integrally. The length of the first cylindrical portion 25a is equal to a first distance. The length of the second cylindrical portion 25b is equal to a second distance.

The second base board 22 is formed into a rectangular shape smaller than the first base board 21. The second base board 22 has four holes for fixing the second base board 22 to the stay 25 by screwing. By placing the second base board 22 on the other ends of the first cylindrical portions 25a of the stays 25 and inserting a screw 26 through each hole of the second base board 22 and screwing the screw 26 into the internal threaded hole at the other ends of the first cylindrical portions 25a of the stay 25, the second base board 22 is mounted on the first base board 21 with the first distance. The second base board 22 is provided at four corners thereof with a through portion 22a for passing the second cylindrical portion 25b of the stay 25.

The third base board 23 is formed into a rectangular shape smaller than the first base board 21 and larger than the second base board 22. The third base board 23 has four holes for fixing the third base board 23 to the stay 25 by screwing. By placing the third base board 23 on the other ends of the second cylindrical portions 25b of the stays 25 and inserting a screw 27 through each hole of the third base board 23 and screwing the screw 27 into the internal threaded hole at the other ends of the second cylindrical portions 25b of the stay 25, the third base board 23 is mounted on the first base board 21 with the second distance. In the embodiment, the second distance is designed longer than the first distance.

Figure 4:
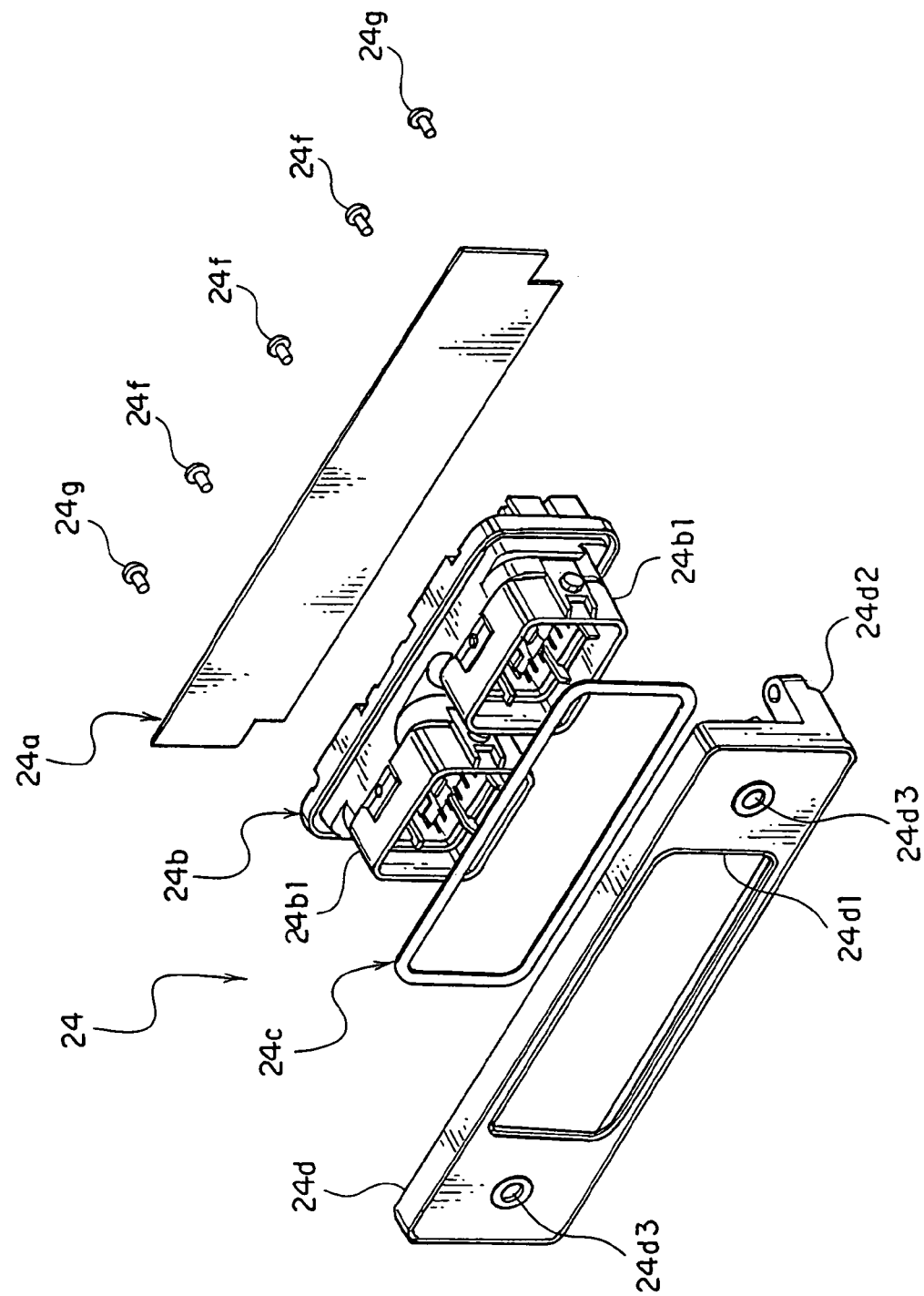
FIG. 4 is an exploded perspective view of a connector unit shown in FIG. 3.

The connector unit 24, as shown in FIG. 4, includes a connector base board 24a, a connector 24b, a connector rubber 24c and a connector panel 24d. The connector 24b is mounted on one surface of the connector board 24a, and a junction connector 24e to be connected with the aforesaid first base board 21 is arranged at the other surface of the connector board 24a. The connector board 24a connects electrically the connector 24b and the junction connector 24e.

The connector 24b includes a pair of male connectors 24b1. Terminals of the male connectors 24b1 project toward the connector board 24a to be electrically connected therewith. The connector rubber 24c is formed with an insulation material into a rectangular shape capable to surround the pair of male connectors 24b1. The connector panel 24d is formed into a rectangular cover shape at the center thereof with an opening 24d1 for projecting male connectors 24b1 of the connector 24b outwardly therethrough. The connector panel 24d has a pair of arms 24d2 formed into a square pole shape. Each one of the pair of arms 24d2 has a hole for passing a screw. The connector panel 24d has a pair of holes 24d3 for passing a screw at the both sides of the opening 24d1.

One example of assembling the connector unit 24 will be described herein. Mounting the connector rubber 24c on the connector 24b, inserting the connector 24b into the connector board 24a, and fixing the connector 24b and the connector base board 24a with three screws 24f, the terminals of the connector 24b are soldered to the connector board 24a. Thereafter, the connector board 24a is fixed on the connector panel 24d with two screws 24g, thereby the connector unit 24 is assembled completely. Since the connector rubber 24c exists between the connector 24b and the connector panel 24d, the connector unit 24 is highly water-sealed to prevent water penetrating into the shield case 3.

The shield case 3 has a first case member 31 and a second case member 32. The shield case 3 is divided into the first case member 31 and the second case member 32 in a plane, in which a projected area of the shield case 3 is minimized. In this embodiment, the shield case 3 is divided into halves at a central portion thereof in a depth direction of the shield case 3 (direction Y in FIG. 2). The projected area of the shield case 3 in a direction perpendicular to the direction Y is minimized, so that a area of connecting the first case member 31 and the second case member 32 can be minimized. Thereby, uniform packing pressure can be loaded on the connecting area, and stable high water sealing performance of the shield case 3 can be maintained.

In the embodiment, the shield case divided into halves will be described. The shield case can be divided by a different way. For example, the shield case 3 can be divided into three or more case members. The shield case 3 can be also divided asymmetrically. For example, dividing the shield case 3 at near end thereof to be a case body and a cover.

The first case member 31 and the second case member 32 respectively includes a conductive panel 33, a panel joint 34 made of synthetic resin at a panel joining area (panel bent area), a receiving section 35 receiving the electric unit 2, an opening 36 arranged at one end of the receiving section 35, a combining piece 37 and a mount portion 38.

The panel 33 made of sheet metal such as aluminum is formed into a hollow rectangular solid shape with the opening 36 at one surface thereof. Thereby, the panel 33 includes a side wall 33a of the first case member 31 and the second case member 32 and a mount wall (bottom wall) 33b of the connector unit 24. A thickness of the panel 33 is not smaller than at least minimum thickness to meet required shield effect. The mount wall 33b has a connector hole 33c for projecting the connector 24b outwardly therethrough when the connector panel 24d abuts on the mount wall 33b.

The first case member 31 and the second case member 32 can be structured by combining plate panels or by combining panel members formed by bending a plate panel.

The panel joint 34 is formed integrally by resin molding at panel joining area at four corners of the panel 3. The panel joint 34 is formed so as to cover all panel joining area in the depth direction (direction Y in FIG. 2) and a height direction (direction Z in FIG. 2) of the shield case 3. Thus, the panel joint 34 can cover the panel joining area of the panel 33 by resin molding, so that the thickness of the panel 33 can be made of thinner sheet metal.

The receiving section 35 is a space formed in the panel 33. The receiving section 35 has volume capable to receive about a half of the electric unit 2. The opening 36 corresponds to the opening formed at one surface of the panel 33. One opening 36 of the first case member 31 has the same dimension as the other opening of the second case member 32 so as to form the shield case 3 by combing the openings 36 to each other.

The combining piece 37 extends from a circumference of the opening 36 toward outside of the shield case 3. The combining piece 37 is formed integrally with the panel joint 34 by resin molding. The combining piece 37 has a plurality of fixing portions 37a (six positions in FIG. 2) to be fastened by fastenings of a bolt 51 and a nut 52. By providing the fixing portions 37a, the combining pieces 37 can be combined securely by the fastenings.

The mount portion 38 is used to mount the shield case 3, that is electric junction box 1, on a mating member (not shown). Each two mount portions 38 are provided respectively at the first case member 31 and the second case member 32. The mount portion 38 is formed integrally with the panel joint 34 by resin molding. The mount portion 38 is fixed on the mating member. The mating member would be a body of a vehicle and a mating apparatus. Thus, the mount portion 38 can be formed integrally with the panel joint 34, that is the mount portion 38 can be molded integrally with the shield case 3, so that a cost of the shield case 3 can be reduced.

The first case member 31 and the second case member 32 include a band plate 39 continued to the panel joint 34 and the combining piece 37 on any surface of the panel 33. On the band plate 39 of the first case member 31, a breather valve to penetrate to the receiving section 35 is mounted retractably.

A panel rubber 4 is a packing made of insulation rubber. A pair of panel rubbers 4 has a shape corresponding to the mount walls 33b of the first case member 31 and the second case member 32. The panel rubbers 4 exist between the connector unit 24 and each mount wall 33b so as to prevent water penetration through the male connector 24b1 of the connector 24b into the shield case 3.

A cover rubber 5 is a packing made of insulation rubber. The cover rubber 5 is formed into a shape given by the combining piece 37 removed the shape of the fixing portions 37a. The cover rubber 5 is clamped between the first case member 31 and the second case member 32 so as to prevent water penetration into the shield case 3.

Figure 3:
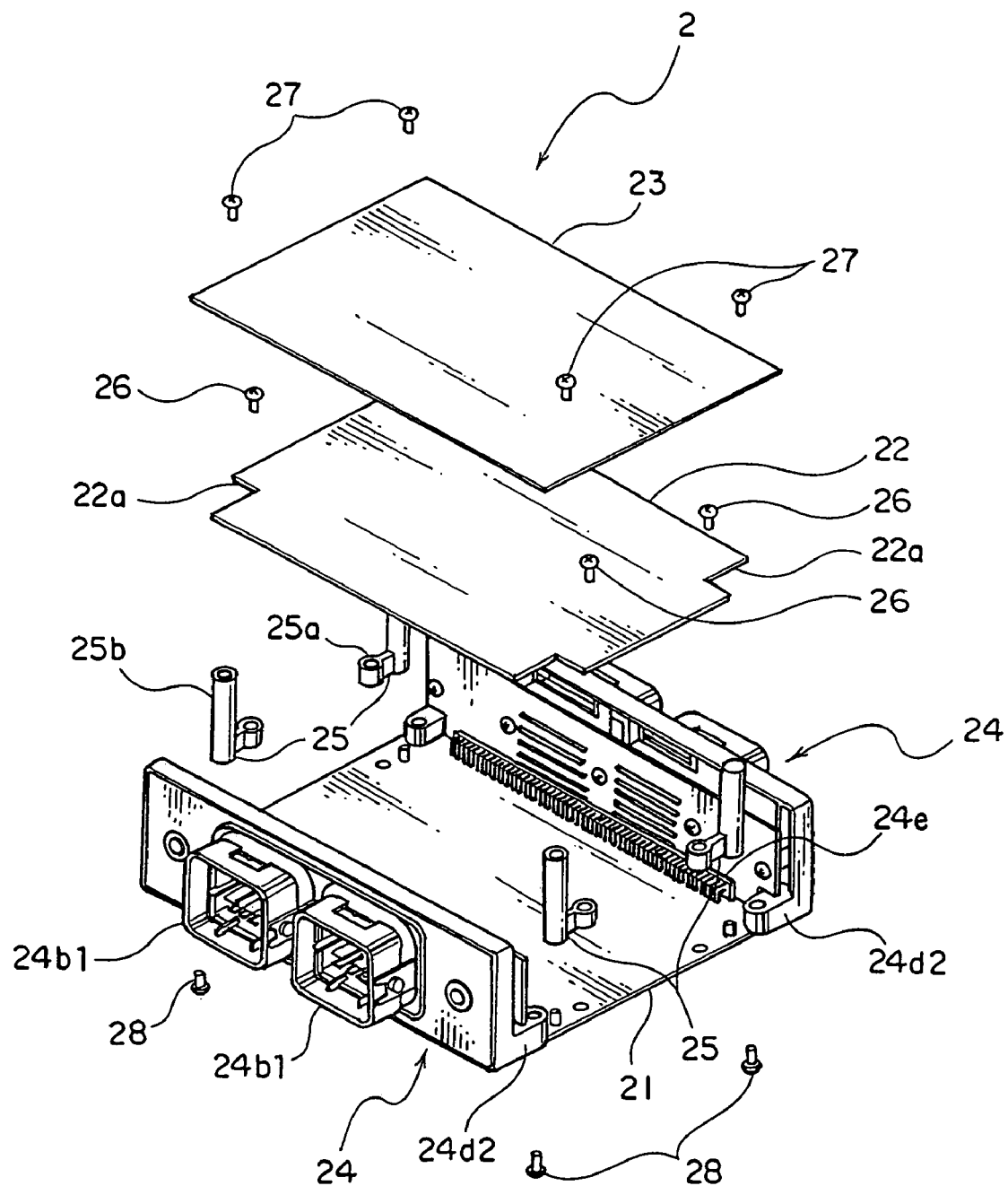
FIG. 3 is an exploded perspective view of an electric unit shown in FIG. 2.

Example of assembling the aforesaid electric junction box 1 will be described herein. As shown in FIG. 3, in the electric unit 2, inserting terminals of the junction connectors 24e of the pair of connector units 24 into the first base board 21, and fixing the arms 24d2 of the connector panel 24d and the first base board 21 with the screws 28 by screwing, successively the junction connector 24e is soldered to the first base board 21. The second base board 22 and the third base board 23 are mounted with four stays 25 and the screws 27, thereby the electric unit 2 is assembled.

Figure 5:
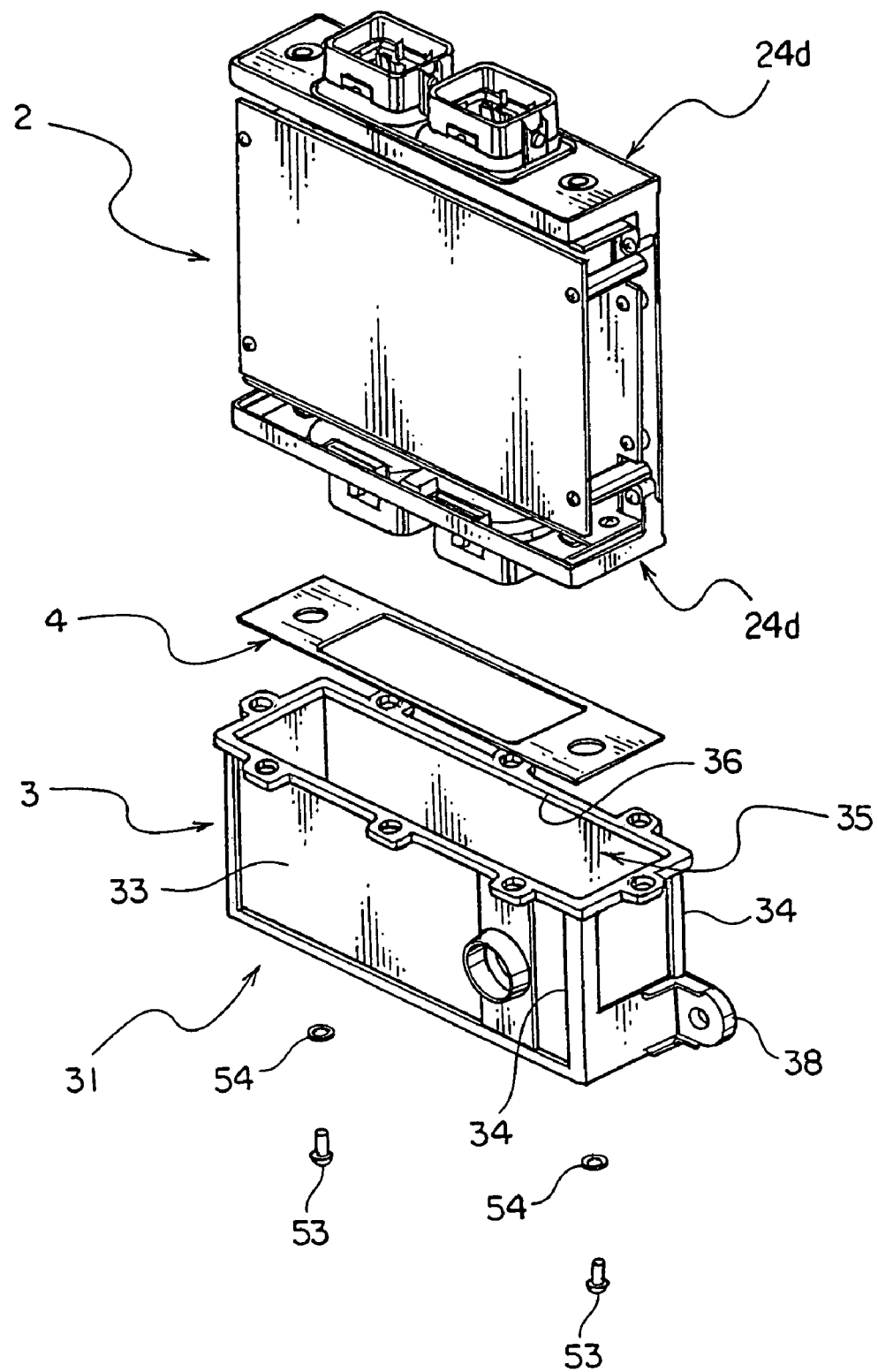
FIG. 5 is an illustration for explaining assembling the electric unit into a case member.

As shown in FIG. 5, placing the panel rubber 4 on the one of connector panels 24d of the electric unit 2, the electric unit 2 is inserted from the opening 36 of the first case member 31 into the receiving section 35. Touching the connector panel 24d to the mount wall 33b of the first case member 31, inserting a screw 53 through a spring washer 54 into each hole 24d3 of the connector panel 24d, the electric unit 2 is fixed to the first case member 31 with the screws 53 by screwing.

Figure 6:
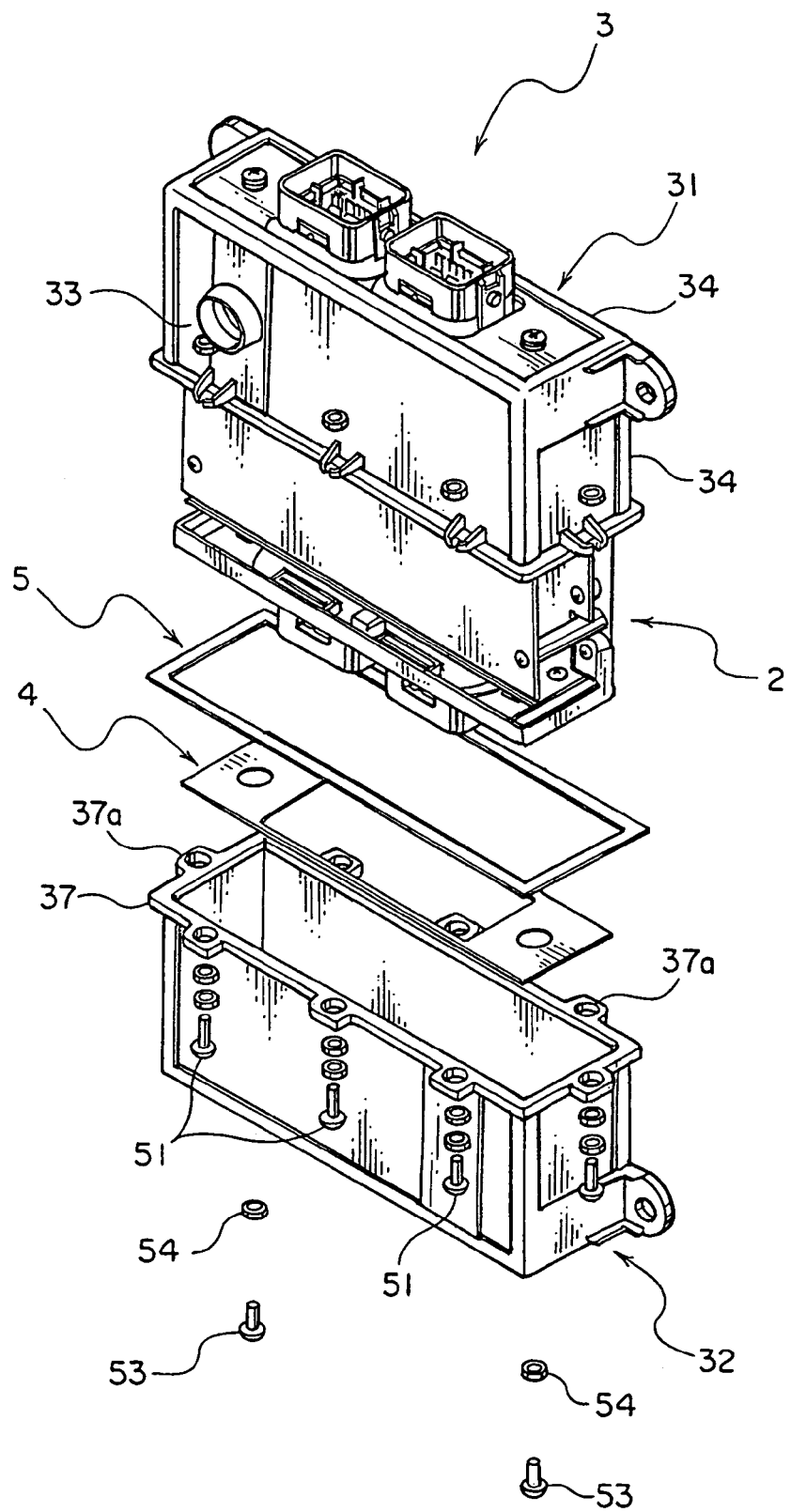
FIG. 6 is an illustration for explaining assembling the case members to each other.

As shown in FIG. 6, placing the panel rubber 4 and the cover rubber 5 on the other of connector panels 24d of the electric unit 2, on one end of which the first case member 31 is mounted, the electric unit is inserted from the opening 36 of the second case member 32 into the receiving section 35. Touching the connector panel 24d to the mount wall 33b of the second case member 32, inserting a screw 53 through a spring washer 54 into each hole 24d3 of the connector panel 24d, the electric unit 2 is fixed to the second case member 32 with the screws 53 by screwing. Thereby, each opening 36 of the first case member 31 and the second case member 32 is corresponded to each other. Fixing the fixing portions 37a of the opening 36 with the bolts 51 and the nuts 52, the first case ember 31 and the second case member 32 are fixed, so that the electric junction box 1 is built up.

In the electric junction box according to the present invention, the panel joint 34 at the panel joining area of the conductive panel 33 is made of synthetic resin, and the shield case 3 is structured with a sheet metal with a thickness to meet the shield effect and synthetic resin, so that a weight of the shield case 3 can be reduced. The panel joint 34 maintains strength of the shield case 3. Therefore, the cost and the weight of the electric junction box can be reduced with maintaining the shield effect.

The first case member 31 and the second case member 32 are respectively provided with the receiving section 35 and the opening 36, and a smooth flat face at a combining surface thereof. Thereby, the shield case 3, which is structured by combining the openings 36 of the first case member 31 and the second case member 32 to each other, can have stable high water-seal performance.

Forming the combining piece 37 integrally with the first case member 31 and the second case member 32, higher pressure can be loaded on the combining piece 37. Thereby, stable high water-seal performance can be given.

While, in the embodiment, the present invention is described, it is not limited thereto. Various change and modifications can be made with the scope of the present invention.

What is claimed is:

1. An electric junction box comprising:
an electric unit; and
a shield case receiving the electric unit,
wherein the shield case comprises a plurality of case members to be separated,
the case member comprising an electric conductive panel and a panel joint made of synthetic resin at a panel joining area of the electric conductive panel,
the electric conductive panel being formed out of sheet metal into a hollow rectangular solid shape with an opening at one surface of the electric conductive panel, and
wherein the plurality of case members are combined to each other so as to form a receiving space for receiving the electric unit in the shield case.

2. The electric junction box according to claim 1, wherein the case members comprise respectively a combining piece made of synthetic resin to combine the mating case member, said combining piece projecting from the opening.

3. The electric junction box according to claim 1, wherein the opening is formed in parallel to a plane, which is the smallest projected area of the shield case.

4. The electric junction box according to claim 1, wherein the shield case comprises a mount portion for mounting the shield case on a mating object, said mount portion being formed integrally with the panel joint.

5. The electric junction box according to claim 1, wherein a thickness of the panel is not smaller than at least minimum thickness to meet required shield effect.

6. The electric junction box according to claim 1, wherein the panel is structured by combining plate panels.

7. The electric junction box according to claim 1, wherein the panel is structured by combining panel members formed by bending a plate panel.

* * * * *